United States Patent [19]

Fouse

[11] 4,426,629

[45] Jan. 17, 1984

[54] TWO-DIMENSIONAL KERNEL GENERATOR FOR TRANSVERSAL FILTERS

[75] Inventor: Scott D. Fouse, Canoga Park, Calif.

[73] Assignee: Hughes Aircraft Company, El Segundo, Calif.

[21] Appl. No.: 334,109

[22] Filed: Dec. 24, 1981

[51] Int. Cl.³ .................... H03H 15/02; G11C 19/14; H01L 27/00

[52] U.S. Cl. ................................ 333/165; 307/238.5; 333/166; 377/62; 357/45; 358/213

[58] Field of Search ..................... 333/165, 166, 167; 307/238.1, 238.2, 238.3, 238.4, 238.5, 238.6, 238.7, 238.8, 238.9; 377/57-63; 357/24, 24 LR, 30, 45; 358/213, 241

[56] References Cited

U.S. PATENT DOCUMENTS 3,796,927  3/1974  Boyle et al. .......................... 357/24
3,913,077  10/1975  Erb .................................... 377/63 X
4,085,456  4/1978  Tompsett ............................ 377/57

OTHER PUBLICATIONS

Sequin–"Two Dimensional Charge Transfer Arrays," IEEE Journal of Solid–State Circuits, vol. SC-9, No. 3, Jun. 1974; pp. 134-142.

Primary Examiner—Marvin L. Nussbaum
Attorney, Agent, or Firm—W. J. Bethurum; A. W. Karambelas

[57] ABSTRACT

In the present invention, image processing is performed at speeds comparable to those achieved in parallel processing without requiring substantially more area on the substrate than that required in serial processing. In this invention, for an N×N processing kernel, N rows of image memory are processed in parallel through a plurality of N floating gate arrays of dimension N×N, N−1 of the data rows from the memory being recirculated through the N floating gate structures before being discarded. Each of the floating gate structures is offset from the adjacent floating gate structure by one row so that the data from memory need be recirculated only once.

19 Claims, 12 Drawing Figures

TWO-DIMENSIONAL KERNEL GENERATOR FOR TRANSVERSAL FILTERS

TECHNICAL FIELD

This invention is related to charge coupled device image data processors.

BACKGROUND ART

Charge coupled device (CCD) image processors of the prior art are disclosed in Nudd et al, "A Charge Coupled Device Image Processor For Smart Sensor Applications," *Proceedings Of The Society Of Photo-Optical Instrumentation Engineers*, Vol. 155 pages 15 through 22 (Aug. 30-31, 1978, San Diego, Calif.) and Fouse et al., "Implentation Of Image Preprocessing Functions Using CCD LSI Circuits," *Proceedings Of The Society Of Photo-Optical Instrumentation Engineers*, Vol. 225 pages 118-130 (April 8-9, 1980, Washington, D.C.). Prior art image processors formed on a single silicon substrate with the imager and the image memory suffer from one of two alternative disadvantages, namely, an excessive amount of space is consumed on the silicon substrate, or else speed and performance are sacrificed. For example, FIG. 1 on page 16 of the above-referenced Nudd publication illustrates a parallel processing concept which maximizes the speed at which image data may be processed but suffers from the disadvantage that the processor occupies an area on the silicon substrate comparable to that occupied by the imager memory. The number of horizontal row elements in the CCD processor must be equal to the number of rows in the image memory, a significant limitation. Alternatively, space may be conserved by using a serial processor of the type illustrated in FIGS. 6 and 7 on page 20 of the above-referenced Nudd publication. However, these require that all the data in the CCD image memory be transferred one row at a time, toward the three-by-three floating gate arrays illustrated therein, thus significantly limiting the speed at which the data from the image memory may be processed. Thus, in the prior art it has not seemed possible to simultaneously achieve the high speed of parallel processing while at the same time reducing the substrate area required by the parallel processor.

SUMMARY OF THE INVENTION

In the present invention, image processing is performed at speeds comparable to those achieved in parallel processing without requiring substantially more area on the substrate than that required in serial processing. In this invention, for an $N \times N$ processing kernel, $N$ rows of image memory are processed in parallel through a plurality of $N$ floating gate arrays of dimension $N \times N$, $N-1$ of the data rows from the memory being recirculated through the $N$ floating gate structures before being discarded. Each of the floating gate structures is offset from the adjacent floating gate structure by one row so that the data from memory need be recirculated only once.

In a particular example, the CCD memory may include several hundred rows and several hundred columns of data, and the dimension of the processing matrix or kernel is $3 \times 3$ (three rows by three columns). In this example, the first three rows of data from the memory are processed in parallel beneath three three-by-three floating gate structures, two of the three rows of data being recirculated through the floating gate structures. The three floating gate structures are progressively offset from each other by one row so that they occupy a total of five rows. The two rows of recirculated data are passed through the last two rows occupied by the floating gate structures. In this manner, the invention operates to pass three rows of data from memory through the three three-by-three floating gate structures in all possible permutations in which the row order is maintained. Accordingly, all processing kernels are generated as the data from memory is unloaded through the floating gate structure of this invention.

BRIEF DESCRIPTION OF THE DRAWINGS

The invention is best understood by reference to the accompanying drawings, of which:

FIG. 1b is an exploded perspective view corresponding to a portion of FIG. 1a;

FIG. 1c is a block diagram illustrating an exemplary image processing technique performed by the device of FIG. 1a;

FIG. 2b is a perspective view corresponding to a portion of FIG. 2a;

FIG. 2c is a simplified schematic diagram illustrating the operation of one floating gate electrode included in a floating gate structure of FIG. 2a; and FIGS. 3a, 3b, 3c, 3d, 3e and 3f are simplified plan views corresponding to a portion of FIG. 2a and illustrating in chronological order a sequence of charge transfer steps implemented in the device of FIG. 2a.

DETAILED DESCRIPTION OF THE INVENTION

The Problem Solved by the Invention

Figure 1A:
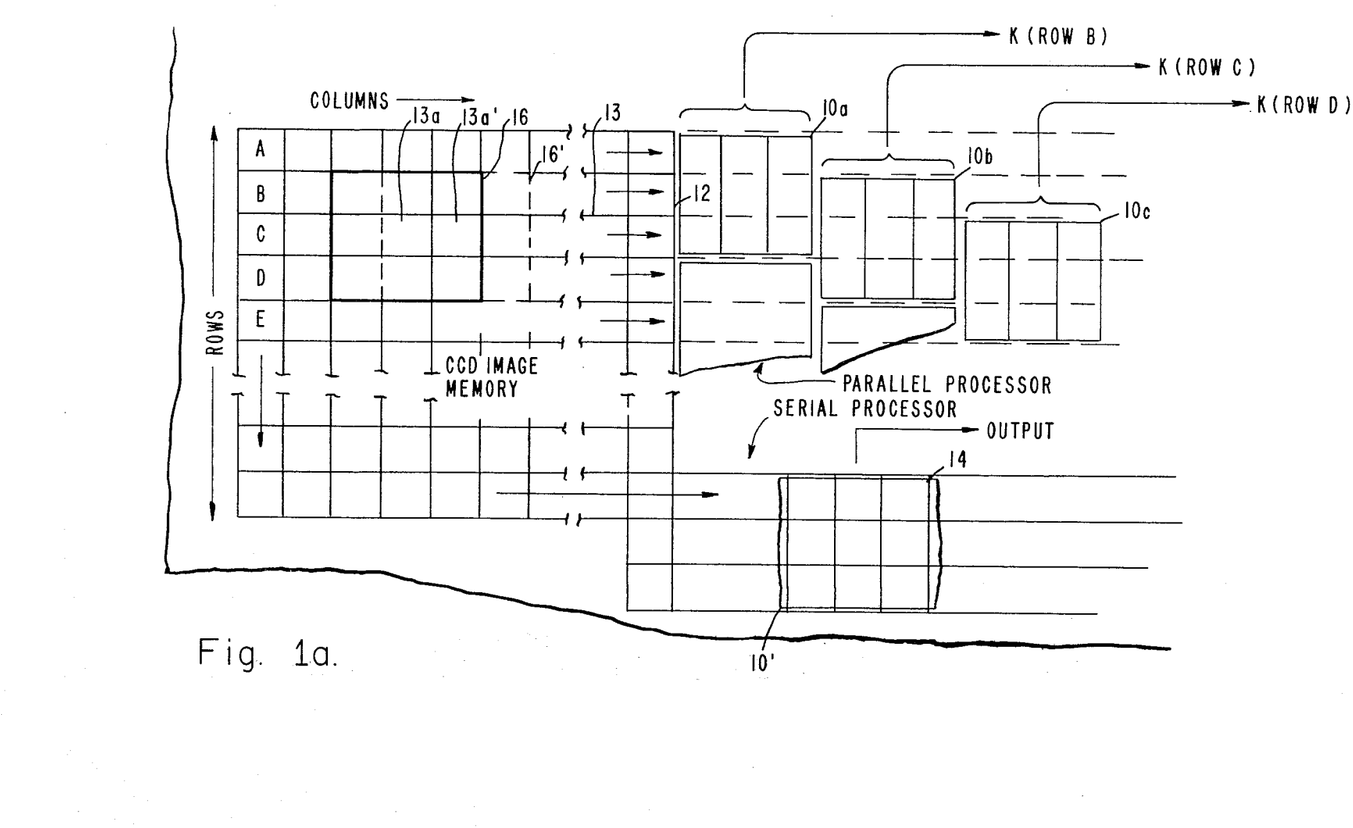
FIG. 1a is a simplified block diagram illustrating the operation of an image processor of the prior art.
Figure 1B:
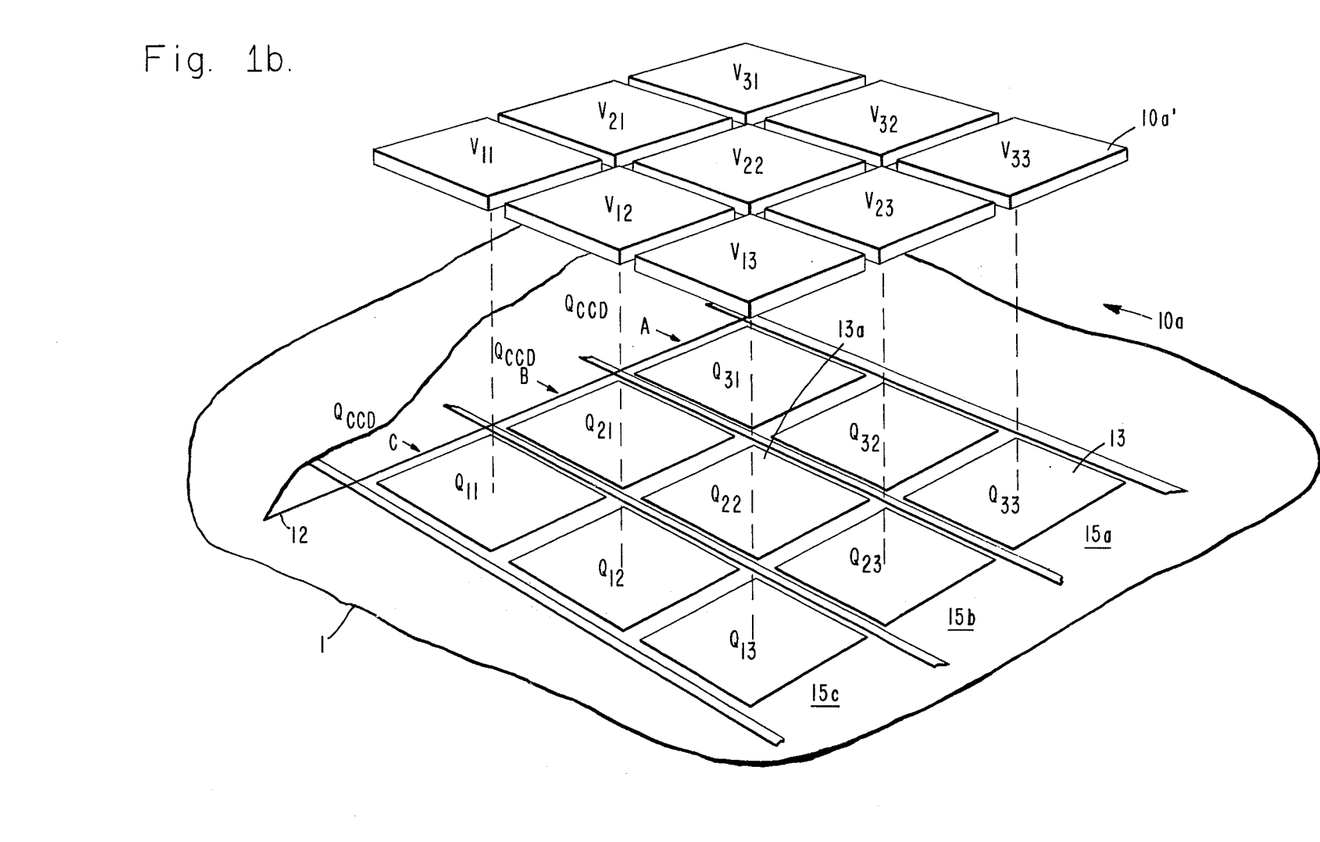

FIG. 1a illustrates a typical use of a three-by-three charge sensing array or floating gate structure 10, of the type illustrated in FIG. 1b, to process data from a CCD image memory 12. The CCD image memory 12 may store, for example, a single video frame comprising 320 rows and 320 columns of pixels represented by individual charge packets 13 organized by row and column on a semiconductive substrate 1.

The edge definition of the image stored in the CCD memory 12 may be dramatically enhanced by the use of well-known image processing algorithms. Such image processing algorithms are discussed in the Nudd publication referenced previously in this specification, the disclosure of which is incorporated herein by reference. In a typical algorithm, a matrix operates on a kernel of image pixels or bits of video data, comprising 3 rows and 3 columns of pixels from the video frame. The matrix operation produces an enhanced value for the "operand" pixel which resides in the middle of the kernel. A "window" or kernel 16 of pixels 13 is illustrated in FIG. 1a and symmetrically surrounds operand pixels 13a. The 3 by 3 array of pixels 13 comprising the "window" or kernel 16 is defined by the following 3 by 3 kernel:

$$k = \begin{matrix} v_{i-1,j-1} & v_{i-1,j} & v_{i-1,j+1} \\ v_{i,j-1} & v_{i,j} & v_{i,j+1} \\ v_{i+1,j-1} & v_{i+1,j} & v_{i+1,j+1} \end{matrix}$$

The middle element, $V_{i,j}$, in this kernel corresponds to the magnitude of the charge packet representing the operand pixel 13a' in the $i^{th}$ row and the $j^{th}$ column of the image memory 12. Image enhancement is performed by changing the value $v_{i,j}$ to an enhanced value $v'_{i,j}$ which is computed using an appropriate image processing matrix or operator.

Enhancement of edges in the image or video frame stored in the memory 12 of FIG. 1 may be accomplished by operating on the kernel 16 with the well-known Sobel operator defined by the matrices:

$$S_1 = \begin{matrix} 1 & 2 & 1 \\ 0 & 0 & 0 \\ -1 & -2 & -1 \end{matrix} \text{ and } S_2 = \begin{matrix} 1 & 0 & -1 \\ 2 & 0 & -2 \\ 1 & 0 & -1 \end{matrix}$$

according to the following equation:

$$v'_{i,j} = |S_1 * k| + |S_2 * k|. \tag{1}$$

The value $v_{i,j}$ representing the operand pixel 13a is replaced by the value $v'_{i,j}$ in the $i^{th}$ row and $j^{th}$ column of the enhanced image.

Each pixel 13 is eventually treated as an operand pixel during successive applications of the Sobel operator as the window or kernel 16 is "moved" into successive locations. Thus, FIG. 1a illustrates that the kernel 16 is located in the solid line position during one operation in which the kernel and the Sobel operator matrix are multiplied in accordance with Equation (1) to generate an enhanced value for the operand pixel 13a. The kernel 16 is subsequently moved to the dashed line position 16' in which the pixel 13a' becomes the operand pixel. The Sobel operator is applied to the kernel 16' to generate an enhanced value for the pixel 13a'. This is best understood by imagining the three-by-three window 16 viewing nine image pixels simultaneously while being moved by row and column so as to progressively view the entire contents of the CCD image memory.

There are two basic techniques for accomplishing the image processing algorithm just described, namely, a parallel processing technique and a serial processing technique. The parallel processing technique employs a plurality of parallel floating gate structures 10a, 10b, 10c, etc. beneath which each row of charge packets in the image memory 12 is transferred in parallel. The serial technique employs a series-parallel-series charge coupled device 14 covered by an overlying floating gate structure 10' partially shown in FIG. 1a.

In the parallel processing technique, the series-parallel-series charge coupled device 14 is not used. Instead, all of the rows A, B, C, etc. of charge packets in the CCD memory 12 are transferred simultaneously, in parallel, beneath the plurality of parallel floating gate structures 10a, b, c, etc. This is best illustrated in FIG. 1b. Rows A, B and C of charge packets from the memory 12 are transferred in parallel through three parallel registers 15a, 15b, 15c underlying the three-by-three floating gate structure 10a. The floating gate structure 10a, illustrated in greater detail in FIG. 1b, comprises nine floating gate electrodes 10a' located directly over a corresponding one of the registers 15. As illustrated in FIG. 1b, a matrix of nine adjacent charge packets $Q_{11}$, $Q_{12}$, etc. is sensed by individual ones of the floating gate electrodes 10a'. Specifically, the charge packet $Q_{11}$ in row 15c generates a voltage $V_{11}$ on one of the floating gate electrodes 10,' as indicated in FIG. 1b, while another charge packet $Q_{33}$ in row 15a generates a voltage $V_{33}$ on another one of the floating gate electrodes 10a'.

Thus, just at the precise instant, during which the charge packets $Q_{11}$, $Q_{12}$, etc. are located as illustrated in FIG. 1b, the floating gate structure 10a generates a kernel k of voltages comprising nine individual voltages from each of the nine floating gate electrodes 10a' in the structure 10a as follows:

$$k = \begin{matrix} v_{11} & v_{12} & v_{13} \\ v_{21} & v_{22} & v_{23} \\ v_{31} & v_{32} & v_{33}. \end{matrix}$$

The charge packet $Q_{22}$ illustrated in FIG. 1b corresponds to the operand pixel 13a at the instant in time depicted in FIG. 1b and corresponds to the voltage or element $V_{22}$ in the kernel k. During the next CCD clocking cycle, each of the charge packets illustrated in FIG. 1b is transferred from left to right by one CCD storage cell, so that $Q_{21}$ is now the new operand pixel 13a'. Therefore, as charge transfer is carried out from left to right in each of the parallel registers 15, during each CCD clocking cycle the floating gate structure 10a will generate another kernel in which a particular one of the charge packets in the middle row 15b is the operand pixel corresponding to the middle element $v_{22}$ in the kernel.

Figure 1C:
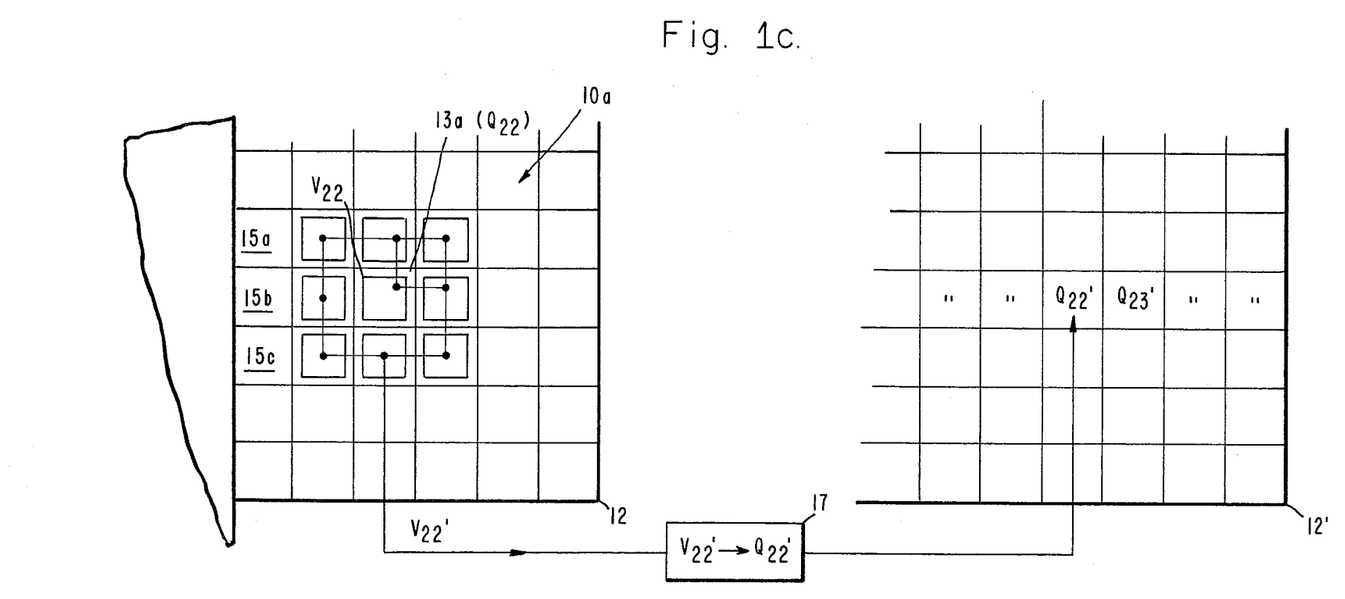

This process may be used, for example, to create a blurred image from the image originally stored in the CCD memory 12. As described in the references cited previously, the blurred image is used with the Sobel operator in the well-known edge enhancement image process. FIG. 1c illustrates one exemplary method for creating the blurred image by superimposing each of the nine pixels contained in the three-by-three kernel 16 surrounding the operand pixel or element $v_{22}$. A new element $v_{22}'$ is generated from this superposition to replace the old element $v_{22}$ as follows:

$$v_{22}' = v_{11} + v_{12} + v_{13} + v_{21} + v_{22} + v_{23} + v_{31} + v_{32} + v_{33}.$$

One simple way of generating the new voltage or element $v_{22}'$ is simply connecting the nine floating gate electrodes 10a' to one another as illustrated in FIG. 1c. The resulting voltage on the common connection is $v_{22}'$, which may be converted in a CCD charge input 17 to a corresponding new charge packet $Q_{22}'$ to be injected into a location in a new CCD memory 12' corresponding to the original location of the operand pixel charge packet $Q_{22}$ in the original CCD memory 12. The operation illustrated in FIG. 1c is repeated each time the charge packets in the parallel registers 15 are transferred by one CCD storage cell. In this manner, new pixels $Q_{22}'$, $Q_{23}'$, etc. are created in the new CCD memory 12' until it is filled with charge packets representative of a blurred image created from the original image stored in the original CCD memory 12.

From the foregoing it should be apparent that the floating gate structure 10a generates in succession all of the kernels or matrices in which each of the individual charge packets in row B of the memory 12 assumes the role of an operand pixel. Similarly, the floating gate structure 10b does the same thing for each of the pixels or charge packets in row C of the memory 12 while the floating gate structure 10c does the same thing for row D. In order to perform the parallel processing technique for each of the rows of charge packets in the CCD memory 12, a plurality of floating gate structures 10 must be provided equal to the number of rows in the memory 12. The disadvantage is that a large area on the underlying semiconductive substrate is occupied, which reduces device density.

In the alternative technique, serial processing is accomplished by transferring the bottom row of charge packets in the CCD memory 12 into the top row of the three-row series-parallel-series charge coupled device 14 and then transferring the charge through the SPS CCD 14 in the manner described, for example, in U.S. Pat. No. 3,913,077, while loading the next row of the memory 12 into the SPS CCD 14. In this manner, the bottom three rows of the memory 12 become stored in the SPS CCD 14 in their original order. The overlying floating gate structure 10', which may cover the entire SPS CCD 14, senses each of the charge packets in the three rows stored therein. The output of each of the individual floating gate electrodes in the floating gate array 10' is fed to an intelligent processor which may reconstruct each of the three-by-three kernels for which a corresponding one of the charge packets in the middle row B of the SPS CCD 14 is an operand pixel. The process is repeated for succeeding rows of the image memory 12.

The disadvantage of the serial processing technique is that data from the memory 12 can be transferred only one row at a time in serial fashion through the CCD SPS array 14, thus limiting the speed at which data may be processed.

Structure of the Invention

Figure 2A:
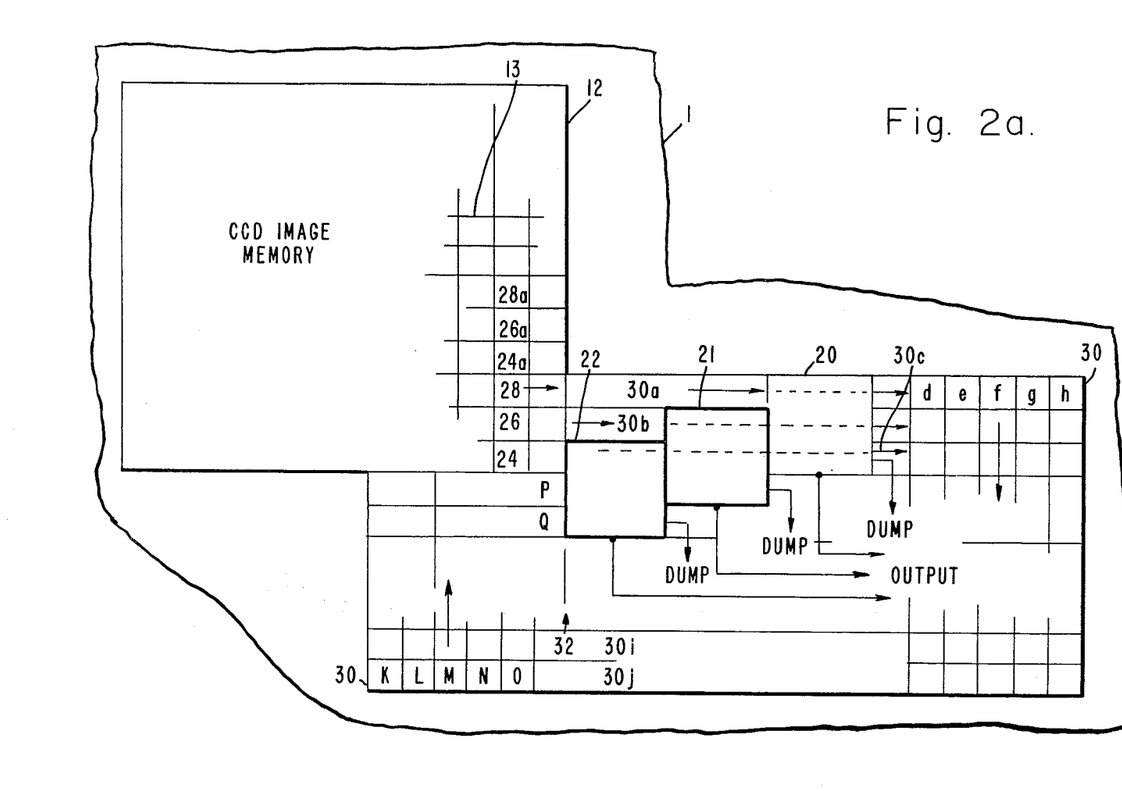
FIG. 2a is a simplified block diagram illustrating the present invention for the case in which a $3 \times 3$ processing kernel is generated.

The foregoing limitations are overcome in the invention illustrated in simplified block diagram form in FIG. 2a. FIG. 2a illustrates the example in which the kernel to be operated upon comprises a three-by-three array of image pixels. In this example, three floating gate structures 20, 21, 22, each comprising three rows and three columns, are placed adjacent one another and adjacent the memory 12, each being progressively offset by one row. In this manner, the three floating gate structures 20, 21, 22 occupy a total of five rows. The top three rows occupied by the floating gate structures 20, 21, 22 receive data from the last three rows 24, 26, 28 of the memory 12.

Figures 2B, 2C:
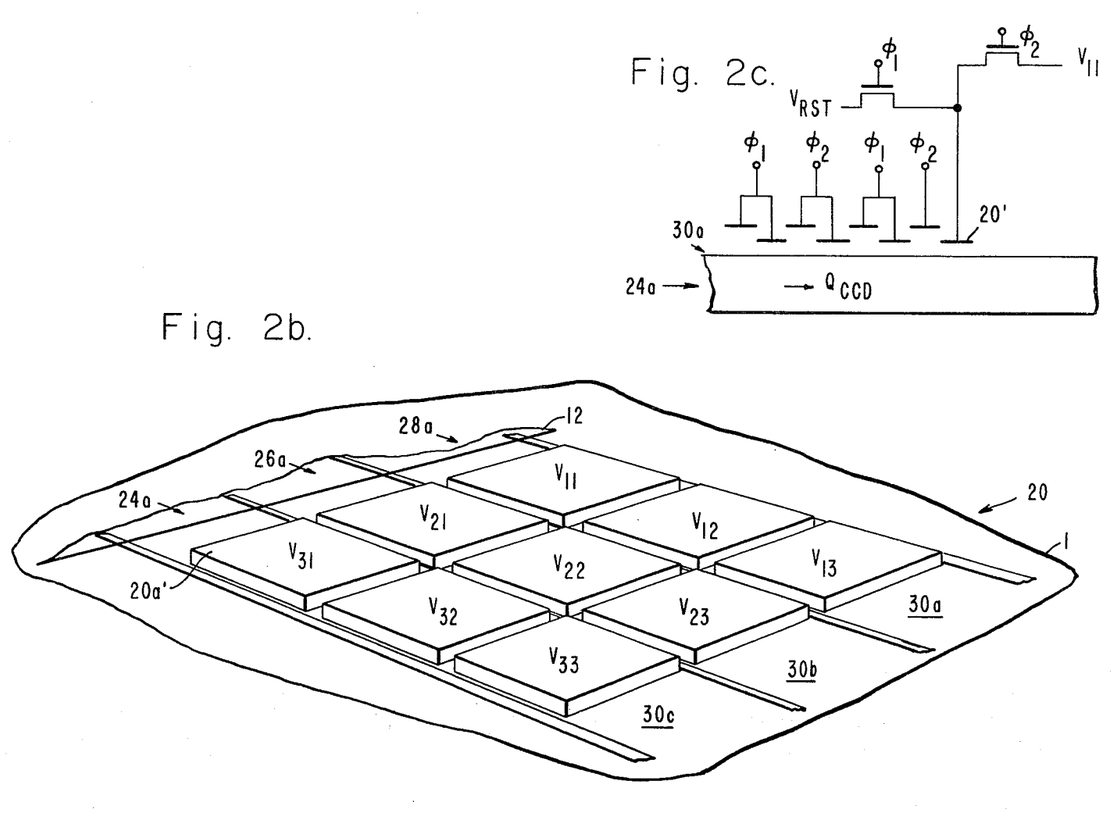

FIG. 2b is an enlarged view of a portion of FIG. 2a illustrating the floating gate structure 20 overlying three parallel CCD registers or rows 30a, 30b, 30c, which are the top three rows occupied by the floating gate structures 20, 21, 22. The floating gate structure 20 includes nine individual floating gate electrodes 20' each overlying a corresponding one of the CCD rows 30a, b, c.

FIG. 2c is a simplified schematic diagram illustrating one way of integrating the floating electrode 20' with the CCD register 30a. The CCD register 30a is illustrated in FIG. 2c as a two-phase charged coupled device controlled by two-phase CCD clock signals $\phi_1$, $\phi_2$. The floating electrode 20' is connected to a reset voltage source $v_{rst}$ in synchronism with the clock signal $\phi_1$ and is connected to generate an output voltage $v_{11}$ in synchronism with the clock signal $\phi_2$. Such floating gate charge sensing structures are disclosed in Sequin et al., Charge Transfer Devices, Academic Press, N.Y., 1975, and need not be described further herein.

In analogy with the example given in FIG. 1b, the floating gate structure 20 of FIG. 2b simultaneously senses nine adjacent charge packets in which the center charge packet corresponds to the operand pixel. In this manner, each of the voltages generated by the individual floating gate electrodes 20' comprises a three-by-three kernel of nine voltage elements:

$$\begin{matrix} v_{11} & v_{12} & v_{13} \\ v_{21} & v_{22} & v_{23} \\ v_{31} & v_{32} & v_{33}. \end{matrix}$$

Three of the charge packets in row 30a lie beneath the corresponding three floating electrodes to generate the top row of elements in the foregoing kernel. The three corresponding charge packets in row 30b generate the voltage elements in the middle row of the foregoing kernel while the corresponding three charge packets present in row 30c generate the three voltage elements in the bottom row of the foregoing kernel. Accordingly, the output of the nine individual electrodes of the floating gate structure 20 at any one instant in time comprises a three-by-three kernel in which the charge packet underlying the middle floating electrode in row 30b corresponds to the operand pixel or element $v_{22}$.

After being transferred beneath the floating gate structures 20, 21, 22, the data or charge packets from the two top memory rows 26, 28, are recirculated and are then transferred through the bottom two rows occupied by the floating gate structures 21 and 22. FIG. 2a shows that the recirculation of data beneath the floating gate structures 20, 21, 22 is accomplished by means of a series-parallel-series (SPS) charge coupled device array 30. (Charge transfer in a series-parallel-series CCD is described in Sequin et al., Charge Transfer Devices, Academic Press, N.Y. (1975), the disclosure of which is incorporated herein by reference).

The series-parallel-series (SPS) charge coupled device (CCD) 30 includes the three input registers 30a, b, c, receiving data from the last three memory rows 28, 26, 24, respectively, and two input registers 30p, q receiving the recirculated data. The three input SPS registers 30a, b, c are the first three of the five rows occupied by the floating gate structures 20, 21, 22, while the two SPS input registers 30p, q are the last two of the five rows occupied by the floating gate structures 20, 21, 22. The data passing through the SPS registers 30c, p, q are dumped after passing beneath the three floating gate structures 20, 21, 22. The data in the registers 30a, b are not dumped but are loaded into vertical column registers 30d, e, f, g, h, comprising five columns to be recirculated as follows: Data in the five column registers 30d through h are transferred down in parallel fashion into serial registers 30i, j, whence they are transferred to parallel column registers 30k, l, m, n, o. The data are then transferred upward in parallel fashion and into the registers 30q, p. The data are then transferred through the registers 30q, p beneath the floating gate arrays 21, 22.

Because the floating gate structures 20, 21, 22 are progressively offset by one row from one another, the floating gate structure 20 senses charge packets (on data) in the first three registers 30a, b, c of the SPS CCD 30, the second floating gate structure 21 senses data in the second set of three registers 30b, 30c, 30p of the SPS array 30 while the third floating gate structure 22 senses data in the last three registers 30c, 30p, 30q of the SPS structure 30. Thus, as a general rule, for an N-by-N floating gate structure, the $I^{th}$ one of the N floating gate structures will sense data in the $I^{th}$ set of N registers (or rows) of the SPS array, in the manner illustrated in FIG. 2.

Operation of the Invention

Operation of the processor of FIG. 2a occurs in two cycles. During the first cycle, data from the last three rows 24, 26, 28 of the image memory 12 are transferred from left to right through the first three registers 30a, 30b, 30c of the SPS array 30 and are sensed by the floating gate structures 20, 21, 22. The data passing through the register 30c of the SPS array is dumped immediately after it has passed beneath the floating gate structures 20, 21, 22. However, the data passing through the registers 30a, 30b of the SPS array 30 are recirculated through the vertical parallel registers 30d, e, f, g, h, thence through the horizontal serial registers 30i, j, through the parallel registers 30k, l, m, n, o and into the serial registers 30p, q so as to fill the serial registers 30p, q. The number of vertical columns in the SPS array 30 (in this particular example, five) is selected so that the first charge packets of the recirculated memory data arrive at starting line 32 of the SPS array 30 just when the last three rows 24, 26, 28 of the memory 12 have been emptied. A skilled worker may compute the number of columns required in the SPS CCD array 30 from the number of columns in the memory 12.

The second cycle of operation begins immediately after the bottom three memory data rows 24, 26, 28 have been emptied from the memory 12. Data from the next three memory data rows 24a, 26a, 28a are then transferred down to replenish the emptied memory data rows 24, 26, 28 respectively. In this second cycle, the replenished data are transferred from left to right into the SPS array registers 30a, b, c beginning at the starting line 32 in parallel with the recirculated data in rows 30q and 30p. It will be remembered that the recirculated data is the data formerly held in memory data rows 26, and 28 during the first cycle. The recirculated data is dumped immediately from the register 30p after passing beneath the second floating gate structure 21 and from the register 30q after passing beneath the third floating gate structure 22. Data transfer during the second cycle is repeated in the same manner as described in connection with the first cycle of operation. In this manner, the last memory data rows 24, 26, 28 are again emptied at the end of the second cycle, after which they are replenished in preparation for the next cycle. At the same time a new set of data has been recirculated through the SPS array 30 to the starting line 32 in preparation for further recirculation in registers 30q, 30p during the next cycle. This completes two cycles of operation.

Generation of the Image Processing Kernels by the Invention

Figure 3A:
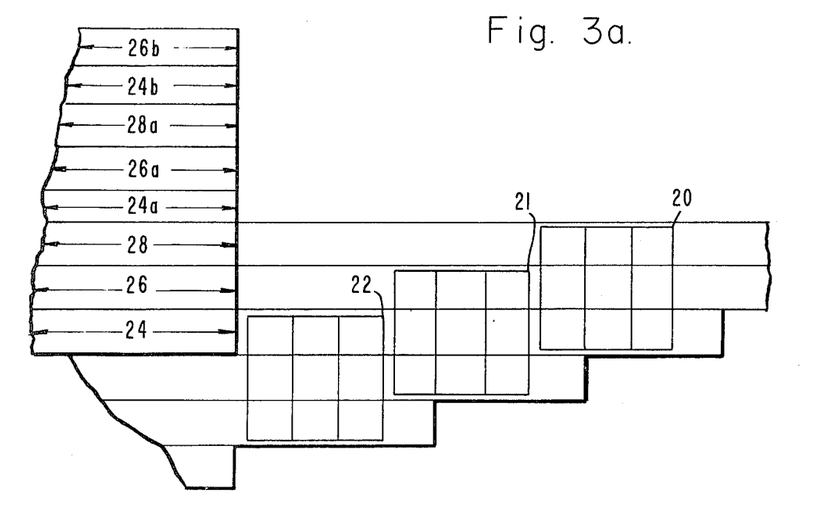

Referring to FIG. 3a, charge packets are stored in the CCD memory 12 and are organized in a succession of rows 24, 26, 28, 24a, 26a, 28a, 24b, 26b. In the following sequence, it will be seen how the invention, in only two cycles of operation, generates all of the three-by-three kernels in which each individual charge packet in the three rows 24a, 26a, 28a assumes the role of an operand pixel in the center of the corresponding kernel.

Figure 3B:
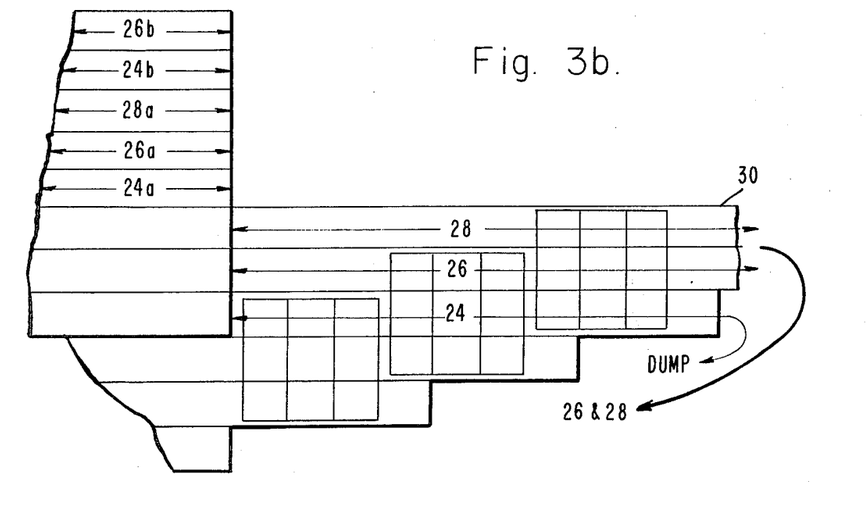
Figure 3C:
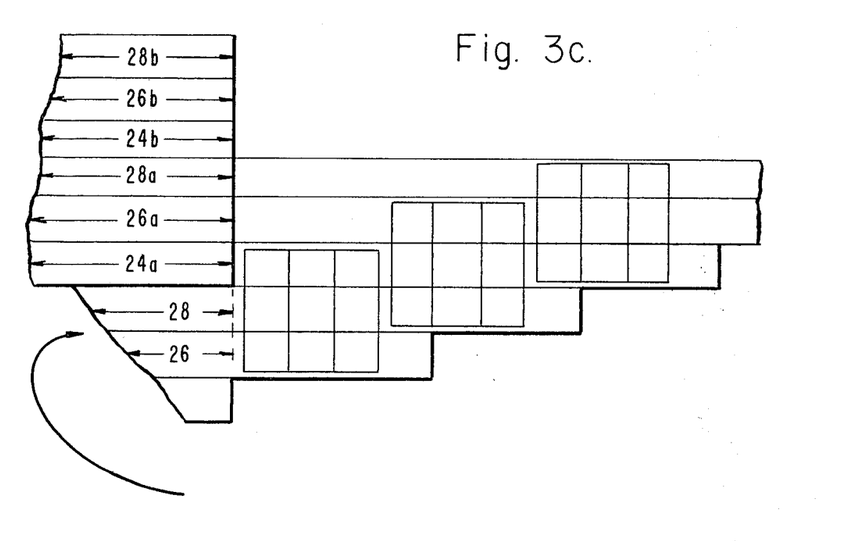
Figure 3D:
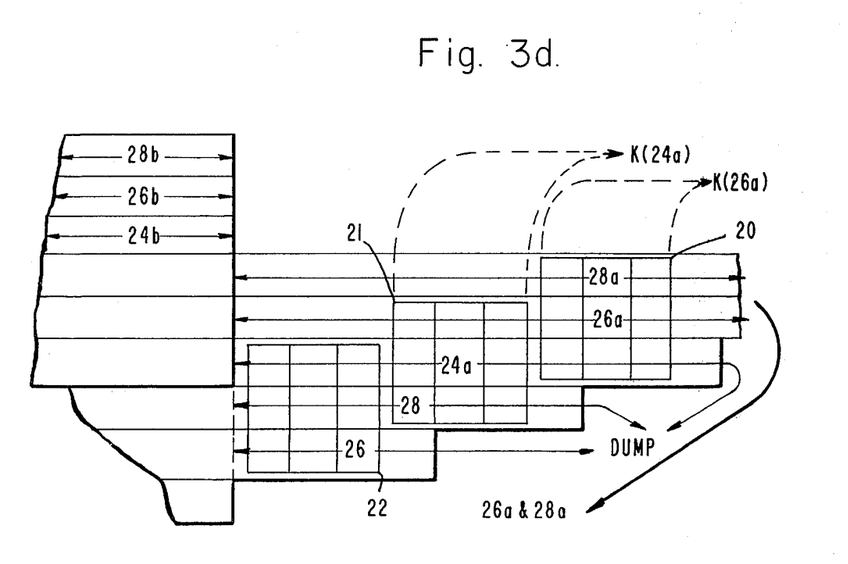

FIG. 3b illustrates the first step in the operation of the invention in which the bottom three rows 24, 26, 28 of charge packets in the memory 12 are transferred in parallel from left to right through the SPS CCD 30. At this time, recirculation of rows 26 and 28 begins. In FIG. 3c, rows 26 and 28 have been recirculated all the way back to starting line 32 in the registers 30p and 30q of the SPS CCD 30. Meanwhile, all the data in the CCD memory 12 has been transferred downward by three rows so that the bottom three rows of the image memory 12 are now occupied by rows 24a, 26a and 28a of charge packets. In FIG. 3d, rows 28a, 26a, 24a, 28 and 26 are transferred from left to right across the starting line 32 beneath the floating gate structures 20, 21, 22. Recirculation of the two data rows 26a, 28a from the top registers 30a, 30b of the SPS CCD 30 is begun at this time. The function of the floating gate 20 during the events depicted in FIG. 3d is best illustrated in FIG. 2b, clearly showing that rows 24a, 26a and 28a of charge packets pass beneath the three-by-three floating gate structure 20. As each charge packet in row 26a is transferred beneath the middle electrode 20" of the floating gate structure 20, the middle electrode 20" generates a corresponding voltage $V_{22}$, while simultaneously the eight surrounding charge packets cause the remaining eight floating electrodes 20' in the array 20 to generate the remaining voltage elements of the corresponding three-by-three kernel. A different kernel is generated during each successive CCD clocking period in which a different charge packet in row 26a underlies the middle floating electrode 20". Each charge packet in row 26a assumes the role of the operand pixel during the time that it underlies the middle floating electrode 20". In FIGS. 2b and 3d, each operand pixel in row 26a is surrounded by the same eight adjacent charge packets that surrounded it when it was originally stored in the CCD memory 12 at the beginning of the operation illustrated in FIG. 3a.

Similarly, the floating gate array 21 performs the same function, except that the charge packets in row 24a successively assume the role of the operand pixel in the kernels generated by the floating gate array 21. Thus, as the data is transferred in the sequence illustrated in FIG. 3d, the floating gate array 20 generates a kernel for each operand pixel in row 26a, while the floating gate array 21 generates a kernel for each operand pixel in row 24a. At this time, a kernel has yet to be generated corresponding to row 28a.

Figure 3E:
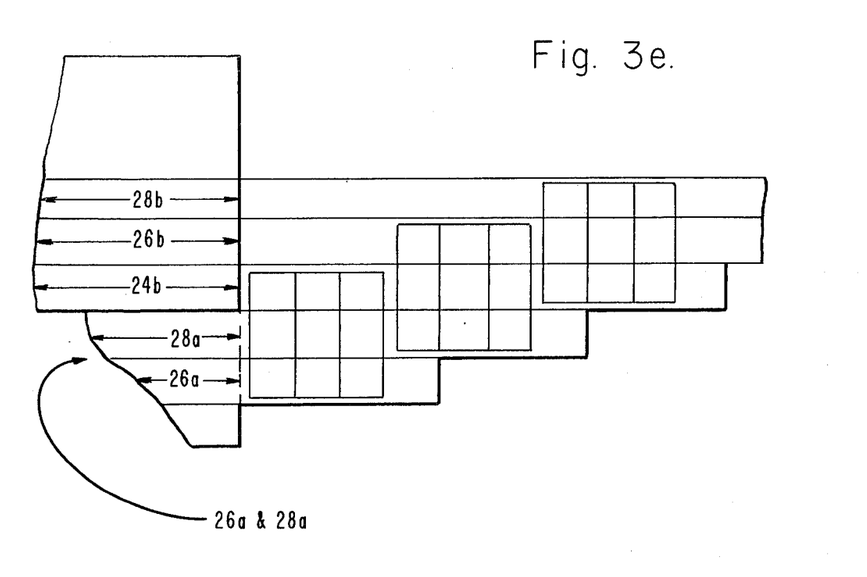
Figure 3F:
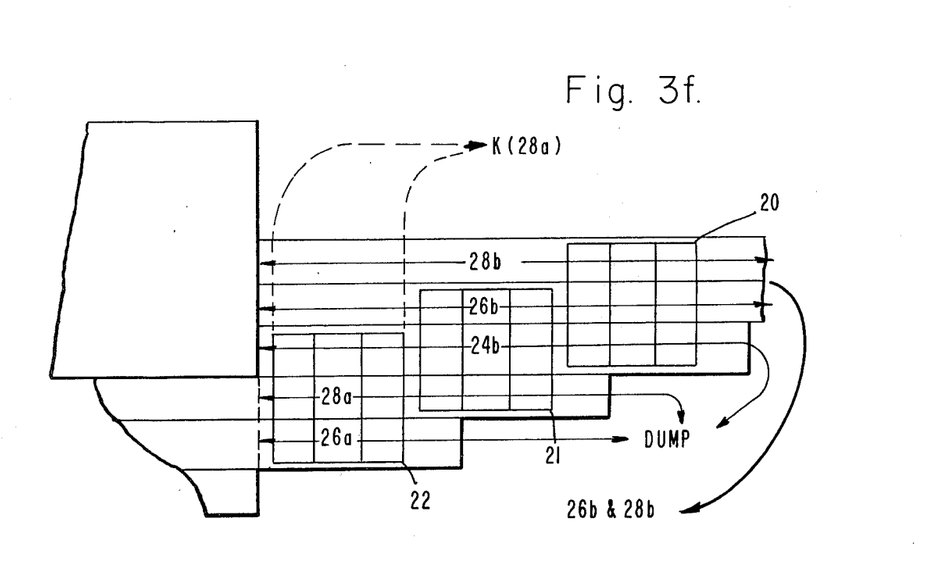

In FIG. 3e, recirculation of rows 26a and 28a has been completed so that they are poised at the starting line 32. Meanwhile, rows 24b, 26b and 28b of charge packets have been transferred to the bottom three rows of the CCD memory 12 so that they, too, lie poised at the starting line 32. The next step is illustrated in FIG. 3f in which the five data rows 26a, 28a, 24b, 26b, 28b are transferred from left to right across the starting line 32. In FIG. 3f, the data transferred beneath floating gate 22 form a kernel for each operand pixel in row 28a. This is because the floating gate array 22' in the sequence illustrated in FIG. 3f overlies three rows of data 26a, 28a, 24b in the same order in which these rows were originally stored in the CCD memory 12. Furthermore, during each CCD clocking period in the sequence illustrated in FIG. 3f, a successive one of the charge packets in row 28a underlies the middle floating electrode of the floating gate array 22, and so that charge packet corresponds to the operand pixel of the three-by-three kernel generated by the floating gate array 22.

In summary, in the operation beginning with FIG. 3d and ending with FIG. 3f, two cycles were performed in which all three-by-three kernels from the three rows 24a, 26a, 28a were generated. In the first cycle, the floating gate arrays 20 and 21 generated the kernels for which each charge packet in rows 26a and 24a assumed the role of operand pixel, respectively. During the second cycle, the floating gate array 22 generated the three-by-three kernel for which each charge packet in row 28a assumed the role of operand pixel.

It is understood, of course, that during each of the sequences illustrated in FIGS. 3d and 3f, all of the 3 three-by-three floating gate arrays 20, 21 and 22 simultaneously generate a corresponding three-by-three kernel for an operand pixel in a corresponding row.

A weighting coefficient may be assigned individually to each of the nine elements in each three-by-three floating gate structure. It will be recognized by a skilled worker that the output from, for example, the second floating gate structure 21 may be characterized as a tensor $T_{JK}$ defined by the following equation:

$$T_{JK} = \sum_{L=-1}^{1} \sum_{M=-1}^{1} W_{LM} S_{J-L, K-M}$$

where $W_{LM}$ is the weighting coefficient assigned to the floating gate in the Lth row and the Mth column of the three-by-three floating gate structure 21, $S_{J-L, K-M}$ is the data bit located in the Jth row and the Kth column of the image memory 12. From this, the output of the first floating gate structure 20 may be defined as the tensor $T_{J+1, K+3}$, while the output of the third floating gate structure 22 may be defined as the tensor $T_{J-1, K-3}$.

It should be recognized that the invention is useful for a floating gate structure for any dimension kernel, including a three-by-three kernel corresponding to the example discussed above or any N×M kernel. Other embodiments of the invention not specifically described herein may be made without departing from the spirit and scope of the invention.

In summary, the invention is a charge coupled device processor useful for processing data as a transversal filter in, for example, an imaging system. The invention uses a unique combination of offset floating gate arrays and partial recirculation of data in a series-parallel-series charge coupled device to achieve a processing speed comparable to that of parallel processors without requiring as much space on the underlying semiconductive substrate.

What is claimed is:

1. A charge transfer device formed on a semiconductive substrate for generating two dimensional kernels having dimensions N by M, comprising:
   a memory array storing a plurality of data in the form of charge packets, said array being organized by rows and columns of said data;
   a first plurality of N parallel charge transfer registers and a second plurality of N−1 parallel charge transfer registers which are parallel with said first plurality of registers;
   means for transferring one set of N of said rows of memory data through said first plurality of N parallel registers;
   means for transferring another set of N−1 of said rows of memory data through said second plurality of N−1 parallel registers in parallel with said one set of N parallel memory data rows simultaneously;
   means for recirculating N−1 of said N rows of said one data from corresponding ones of said first plurality of N parallel registers to said second plurality of N−1 parallel registers; and
   means for sensing M arrays of data in said first and second plurality of parallel registers, each of said arrays comprising M columns and N rows of data, each of said arrays being offset from an adjacent array by M columns in a direction parallel to said rows and by one row in a direction parallel to said columns.

2. The charge transfer device of claim 1 wherein said recirculating means comprise a series-parallel-series charge coupled device.

3. The charge transfer device of claim 2 wherein said first plurality of N parallel registers and said second plurality of N−1 parallel registers comprises one serial section of said series-parallel-series charge coupled device, comprising a total of 2N−1 serial registers, said first plurality of N registers receiving data directly from said memory and said second plurality of N−1 registers receiving data recirculated through said series-parallel-series charge coupled device.

4. The charge transfer device of claim 1 wherein said recirculating means begins transfer of a previous set of N−1 rows of data through said second plurality of registers simultaneously with the beginning of transfer of a subsequent set of N rows of said data through said first plurality of parallel registers.

5. The charge transfer device of claim 1 wherein said sensing means comprise N floating gate structures, each of said N floating gate structures comprising an N by N array of floating gates for sensing charge packets in said first and second pluralities of parallel registers.

6. The charge transfer device of claim 1 wherein said memory array comprises a charge coupled device memory array storing charge packets.

7. The charge transfer device of claim 1 wherein N=M, N=3 and wherein said first and second plurality of parallel registers comprise a parallel array of five parallel registers.

8. A charge transfer device formed on a semiconductive substrate, including a first plurality of N parallel serial registers and a second plurality of N−1 parallel serial registers parallel with said first plurality of registers, for generating two-dimensional kernels having dimensions N by M, comprising:
   means for transferring N data rows of charge packets in parallel through said first plurality of N registers and then recirculating N−1 of said N data rows through said second plurality of N−1 registers; and
   means for sensing N arrays of rows and columns of said charge packets in said first and second plurality of registers, each of said arrays having dimensions corresponding to N rows and M columns of said charge packets, each of said arrays being offset from an adjacent array by M columns in a direction parallel to said rows and by one row in a direction parallel to said columns, said rows being parallel to the direction of said pluralities of parallel registers.

9. The charge transfer device of claim 8 wherein said recirculating means comprises a series-parallel-series charge transfer device array, a portion of which comprises 2N−1 parallel serial registers, N of said 2N−1 registers receiving said input data directly and N−1 of said 2N−1 parallel registers receiving data recirculated through said series-parallel-series charge transfer device.

10. The charge transfer device of claim 8 wherein said sensing means comprise N floating gate arrays, each of said arrays comprising a plurality of N×M individual floating gates, each of said floating gates being positioned over said substrate so as to be able to sense a charge packet in a respective one of said rows and columns.

11. A charge transfer device transversal filter, comprising:
- a series-parallel-series charge transfer device including a serial portion comprising $2N-1$ parallel serial registers, N of said parallel registers positioned to receive N serial rows of charge packets of which $N-1$ rows are recirculated through the other $N-1$ of said $2N-1$ parallel registers; and
- N arrays of floating gates overlying said $2N-1$ registers, each of said arrays comprising a plurality of floating gates organized in N rows and M columns, adjacent ones of said gate arrays being offset by one row from one another, each of said gates being positioned over said substrate so as to sense a charge packet in the corresponding row and column in said serial portion.

12. The transversal filter of claim 11 wherein an individual signal is derived from each of said individual floating gates.

13. The transversal filter of claim 12 wherein an individual weighting coefficient is associated with each one of said individual floating gates.

14. The charge transfer device of claim 11 further comprising a source of charge packets positioned to periodically furnish N charge packets to said N registers in parallel.

15. The transversal filter of claim 14 wherein said source of charge packets comprises a charge coupled device memory.

16. In a charge transfer device formed on a semiconductive substrate including a memory array storing a plurality of data in the form of charge packets, said array being organized by rows and columns of said data, a first plurality of N parallel charge transfer registers and a second plurality of $N-1$ parallel charge transfer registers which are parallel with said first plurality of registers, a process for generating all two dimensional kernels having dimensions N by M from said stored data, comprising:
- transferring one set of N of said rows of memory data through said first plurality of N parallel registers;
- recirculating $N-1$ of said N rows of said one data set from corresponding ones of said first plurality of N parallel registers to said second plurality of $N-1$ parallel registers;
- transferring a subsequent set of N rows of said memory data through said first plurality of N parallel registers and transferring said recirculated set of $N-1$ parallel memory data rows through said second plurality of $N-1$ registers simultaneously; and
- sensing M arrays of data in said first and second plurality of parallel registers, each of said arrays comprising M columns and N rows of data, each of said arrays being offset from an adjacent array by M columns in a direction parallel to said rows and by one row in a direction parallel to said columns.

17. The process of claim 16 wherein said recirculating step follows the transfer of a previous set of $N-1$ rows of data through said second plurality of registers.

18. In a charge transfer device formed on a semiconductive substrate, including a first plurality of N parallel serial registers and a second plurality of $N-1$ parallel serial registers parallel with said first plurality of registers, a process for generating two dimensional kernels having dimensions N by M, comprising:
- transferring N data rows of charge packets in parallel through said first plurality of N registers and then recirculating $N-1$ of said N data rows through said second plurality of $N-1$ registers;
- sensing N arrays of rows and columns of said charge packets in said first and second plurality of registers, each of said arrays having dimensions corresponding to N rows and M columns of said charge packets, each of said arrays being offset from an adjacent array by M columns in a direction parallel to said rows and by one row in a direction parallel to said columns, said rows being parallel to the direction of said pluralities of said parallel registers; and
- repeating said process for subsequent groups of N data rows.

19. The process of claim 16, 17 or 18 wherein $N=M=3$.

* * * * *